(12) United States Patent  
Ryan et al.

(10) Patent No.: US 10,291,231 B2
(45) Date of Patent: May 14, 2019

(54) SUPERCONDUCTING DEVICE WITH DUMMY ELEMENTS

(71) Applicant: Microsoft Technology Licensing, LLC, Redmond, WA (US)

(72) Inventors: Vivian W. Ryan, Severn, MD (US); Eric J. Jones, Linthicum Heights, MD (US)

(73) Assignee: Microsoft Technology Licensing, LLC, Remond, WA (US)

( * ) Notice: Subject to any disclaimer, the term of this patent is extended or adjusted under 35 U.S.C. 154(b) by 426 days.

(21) Appl. No.: 15/215,479

(22) Filed: Jul. 20, 2016

(65) Prior Publication Data

US 2018/0131376 A1    May 10, 2018

(51) Int. Cl.
*H03K 19/195* (2006.01)
*H01L 23/532* (2006.01)
(Continued)

(52) U.S. Cl.
CPC ..... *H03K 19/195* (2013.01); *H01L 23/53285* (2013.01); *H01L 39/025* (2013.01);
(Continued)

(58) Field of Classification Search
CPC . H03K 19/195; H01L 39/025; H01L 39/2406; H01L 39/223; H01L 39/2493; H01L 39/12
See application file for complete search history.

(56) References Cited

U.S. PATENT DOCUMENTS

| | | |
|---|---|---|
| 4,954,480 A | 9/1990 | Imanaka et al. |
| 5,179,070 A | 1/1993 | Harada |

(Continued)

FOREIGN PATENT DOCUMENTS

| | | |
|---|---|---|
| JP | S61140185 A | 6/1986 |
| JP | S63194376 A | 8/1988 |

(Continued)

OTHER PUBLICATIONS

"International Search Report and written opinion Issued in PCT Application No. PCT/US2017/041803", dated Sep. 27, 2017, 12 Pages.

(Continued)

*Primary Examiner* — Julia Slutsker
(74) *Attorney, Agent, or Firm* — Ranjeev Singh; Singh Law, PLLC

(57) ABSTRACT

Examples described in this disclosure relate to superconducting devices, including reciprocal quantum logic (RQL) compatible devices. A superconducting device including at least one superconducting element having a first coefficient of thermal expansion is provided. The at least one superconducting element is formed on a dielectric layer having a second coefficient of thermal expansion and the first coefficient of thermal expansion is different from the second coefficient of thermal expansion causing a strain mismatch between the at least one superconducting element and the dielectric layer when the superconducting device is operating in a cryogenic environment. The superconducting device may also include at least one dummy element configured to lower stress at an interface between the at least one superconducting element and the dielectric layer when the at least one superconducting device is operating in the cryogenic environment.

17 Claims, 3 Drawing Sheets

(51) Int. Cl.
  *H01L 39/14* (2006.01)
  *H01L 39/02* (2006.01)
  *H01L 39/12* (2006.01)
  *H01L 39/22* (2006.01)
  *H01L 39/24* (2006.01)
  *H01L 27/18* (2006.01)

(52) U.S. Cl.
  CPC .............. *H01L 39/12* (2013.01); *H01L 39/14* (2013.01); *H01L 39/223* (2013.01); *H01L 39/2406* (2013.01); *H01L 39/2493* (2013.01); *H01L 27/18* (2013.01)

(56) References Cited

U.S. PATENT DOCUMENTS

| | | |
|---|---|---|
| 5,578,226 A | 11/1996 | Chan et al. |
| 5,906,965 A | 5/1999 | Rao |
| 6,312,791 B1 | 11/2001 | Fasano et al. |
| 6,436,470 B1 | 8/2002 | Iacocca et al. |
| 6,987,316 B2 | 1/2006 | Reddy et al. |
| 8,301,214 B1 | 10/2012 | Tolpygo et al. |
| 8,570,122 B1 | 10/2013 | Hammond |
| 2004/0157747 A1 | 8/2004 | Chen et al. |
| 2010/0032857 A1 | 2/2010 | Izadnegahdar et al. |

FOREIGN PATENT DOCUMENTS

| | | |
|---|---|---|
| JP | S6466956 A | 3/1989 |
| JP | H0337913 A | 2/1991 |
| JP | 2004262673 A | 9/2004 |

OTHER PUBLICATIONS

Yang, et al., "Microstructure characterization of MgO buffered YBa2Cu 3O7 on (100) Si during thermal cycling", In IEEE Transactions on Applied Superconductivity, vol. 11, Issue 1, Mar. 2001, 1 page.

SUPERCONDUCTING DEVICE WITH DUMMY ELEMENTS

BACKGROUND

Semiconductor based integrated circuits used in electronic devices include digital circuits based on complimentary metal-oxide semiconductor (CMOS) technology. CMOS technology, however, is reaching its limits in terms of the device size. In addition, leakage current in CMOS based devices is causing high power consumption even when these devices are not in use.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing operations, certain amount of power is wasted not only because of the requirement to maintain the state of the CMOS transistors, but also because of the current leakage.

An alternative approach to CMOS technology based devices is the use of superconducting logic based devices.

SUMMARY

In one example, the present disclosure relates to a superconducting device including at least one superconducting element having a first coefficient of thermal expansion. The at least one superconducting element is formed on a dielectric layer having a second coefficient of thermal expansion and the first coefficient of thermal expansion is different from the second coefficient of thermal expansion causing a strain mismatch between the at least one superconducting element and the dielectric layer when the superconducting device is operating in a cryogenic environment. The superconducting device may also include at least one dummy element configured to lower stress at an interface between the at least one superconducting element and the dielectric layer when the at least one superconducting device is operating in the cryogenic environment.

In another aspect, the present disclosure relates to a superconducting device including at least one superconducting wire having a first coefficient of thermal expansion. The at least one superconducting wire is formed on a dielectric layer having a second coefficient of thermal expansion and the first coefficient of thermal expansion is different from the second coefficient of thermal expansion causing a strain mismatch between the at least one superconducting wire and the dielectric layer when the superconducting device is operating in a cryogenic environment. The superconducting device may also include at least one dummy element comprising a plurality of nubs, where each of the plurality of nubs is formed along the at least one superconducting wire. Each of the plurality of nubs is configured to lower stress at an interface between the at least one superconducting wire and the dielectric layer when the at least one superconducting device is operating in the cryogenic environment.

In yet another aspect, the present disclosure relates to a superconducting device including at least one superconducting wire having a first coefficient of thermal expansion. The at least one superconducting wire is formed on a dielectric layer having a second coefficient of thermal expansion and the first coefficient of thermal expansion is different from the second coefficient of thermal expansion causing a strain mismatch between the at least one superconducting wire and the dielectric layer when the superconducting device is operating in a cryogenic environment. The superconducting device may further include at least one dummy element including a plurality of nubs and at least one via. Each of the plurality of nubs is formed along the at least one superconducting wire, where each of the plurality of nubs is configured to lower stress at an interface between the at least one superconducting wire and the dielectric layer when the at least one superconducting device is operating in the cryogenic environment. The at least one dummy element may further include at least one via, where the at least one superconducting wire is formed in a plane and the at least one via extends in a direction that is orthogonal to the plane.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
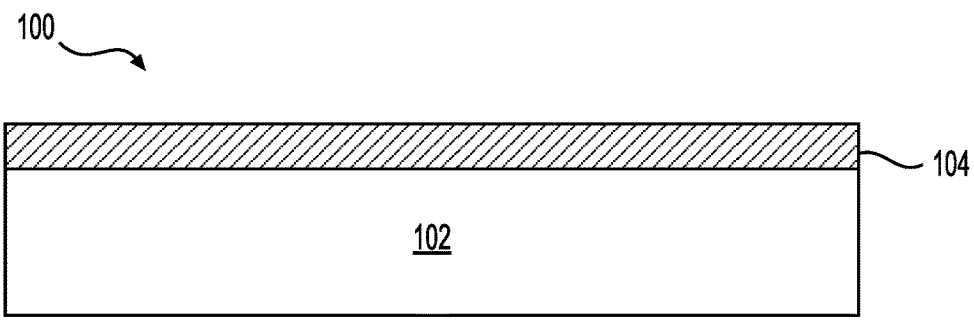
FIG. 1 shows a cross-section view of a superconducting device in accordance with one example.

Examples described in this disclosure relate to superconducting devices, including reciprocal quantum logic (RQL) compatible devices. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have zero resistance. Superconductors, such as niobium, have a critical temperature (Tc) below which they have zero resistance. Niobium, one such superconductor, has a critical temperature (Tc) of 9.3

Kelvin degrees. At temperatures below Tc, niobium is superconductive; however, at temperatures above Tc, it behaves as a normal metal with electrical resistance. Thus, in the SIS type of Josephson junctions, superconductors may be niobium superconductors and insulators may be $Al_2O_3$ barriers. In SIS type of junctions, the superconducting electrons are described by a quantum mechanical wave-function. A changing phase difference in time of the phase of the superconducting electron wave-function between the two superconductors corresponds to a potential difference between the two superconductors. In RQL circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power thereby eliminating the ground return current. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

The building blocks of exemplary RQL circuits may include various types of logic gates. Exemplary logic gates include an AND gate, an OR gate, a logical A-and-not-B (AanB) gate and a logical AND & OR (AndOr) gate. The AanB gate may have two inputs and one output (Q). An input pulse A may propagate to output Q unless an input pulse B comes first. The AndOr gate may have two inputs and two outputs (Q1 and Q2). The first input pulse, input pulse A or input pulse B goes to output Q1 and the second input pulse goes to output Q2. The logical behavior of these gates may be based on the reciprocal data encoding mentioned earlier. As an example, a positive pulse changes the internal flux state of the inductive loop, but the trailing negative pulse erases the internal state every clock cycle, which in turn produces combinational logic behavior.

Many semiconductor devices include superconducting wires or other such structures that interface with dielectrics or insulating materials formed in the devices. These different materials have different coefficients of thermal expansion (CTE). As an example, niobium has a CTE in a range of 6.8E-6 to 7.3E-6 per degree Kelvin. A dielectric, such as silicon-dioxide, has a CTE of approximately 0.5E-6 per degree Kelvin. As discussed earlier, superconducting devices operate at cryogenic temperatures that may be at or below 4 degrees Kelvin. In one example, the cryogenic environment may correspond to a temperature in a range of 4 Kelvin to 77 Kelvin. At these thermal excursions, the CTE mismatch between metal-dielectric interfaces can create several problems. First, the mechanical stress at the interface may be large enough to cause delamination or other types of failures. Second, even if the mechanical stress is not large enough to cause a critical failure, the micro-cracks caused by the stress may create problems. As an example, when the Cooper pairs traveling along a superconducting wire hit a micro-crack, there may be a flux divergence. This is because superconductivity is not a bulk phenomenon; instead, it is a surface phenomenon. The presence of a number of such micro-cracks may substantially reduce the performance of the superconducting device. Dense integration of superconducting materials and dielectric materials leads to highly complex material compositions and layouts that exacerbate the stresses experienced by fine superconducting metal lines or wires. For example, one of the problem areas is narrow long wires where the surrounding dielectric imposes the highest amount of stress on the metal. Under superconductivity conditions, the metal wire may pull away from the dielectric, particularly along the sidewall interface. That may in turn cause delamination and channel cracks, such as micro-cracks. Another related problem is the excessive increase in niobium lattice spacing along the long axis of the superconducting line or wire. This increased spacing may lower the density of niobium atoms and thus decrease the amount of the superconducting current that can flow through the superconducting wire.

The present disclosure provides several examples of dummy elements that may be formed to alleviate these problems. As an example, by inserting strain reservoir structures at susceptible sites in a circuit layout, the effects of the enormous stress difference across metal-dielectric interfaces may be mitigated. These strain reservoirs may act as: (1) anchors to shore up metal-dielectric attachment and (2) sources of stress-buffer material to reduce strain at the metal-dielectric interfaces. In one example, the reservoirs are dummy elements in that they are electrically passive elements. In one example, the dummy elements are attached to superconducting wires that may be both long and fine. In this example, the dummy elements are configured as nubs that protrude from the wire in roughly the same plane as the plane of the wire. In one example, the dummy elements are made using materials that have a coefficient of thermal expansion between that of a superconducting metal, such as niobium, and a dielectric, such as silicon-dioxide.

FIG. 1 shows a cross-section view 100 of a superconducting device in accordance with one example. As shown, during a processing stage, the superconducting device may include a dielectric layer 104 formed over a substrate 102. Substrate 102 may be a silicon substrate, a sapphire substrate, or a glass substrate. Dielectric layer 104 may comprise diamond, silicon-dioxide, silicon-nitride, silicon-carbide, silicon-oxycarbide, Siloxane, synthetic rubber, or another appropriate insulating material. Dielectric layer 104 may also be a combination of any of these or other materials. Dielectric layer 104 may be deposited or grown over substrate 102. Although FIG. 1 shows a certain number of layers of the superconducting device arranged in a certain manner, there could be more or fewer numbers of layers arranged differently.

Figure 2:
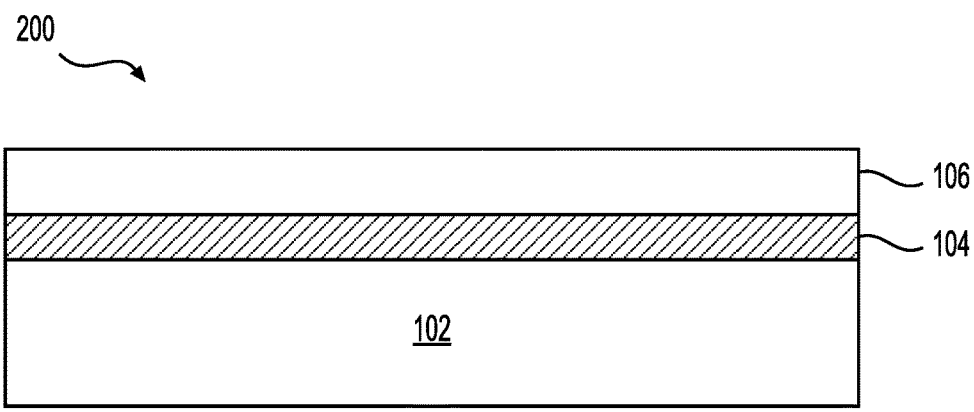
FIG. 2 shows a cross-section view of a superconducting device in accordance with one example.

FIG. 2 shows a cross-section view 200 of a superconducting device at another stage of processing in accordance with one example. A superconducting layer 106 may be formed over dielectric layer 104. Superconducting layer 106 may be formed using any of the deposition techniques, such as CVS or PCVD. In this example, superconducting layer 106 may be formed by depositing niobium over dielectric layer 104. Other superconducting metals or metal alloys may also be used as part of this step. Although FIG. 2 shows a certain number of layers of the superconducting device arranged in a certain manner, there could be more or fewer numbers of layers arranged differently.

Figure 3:
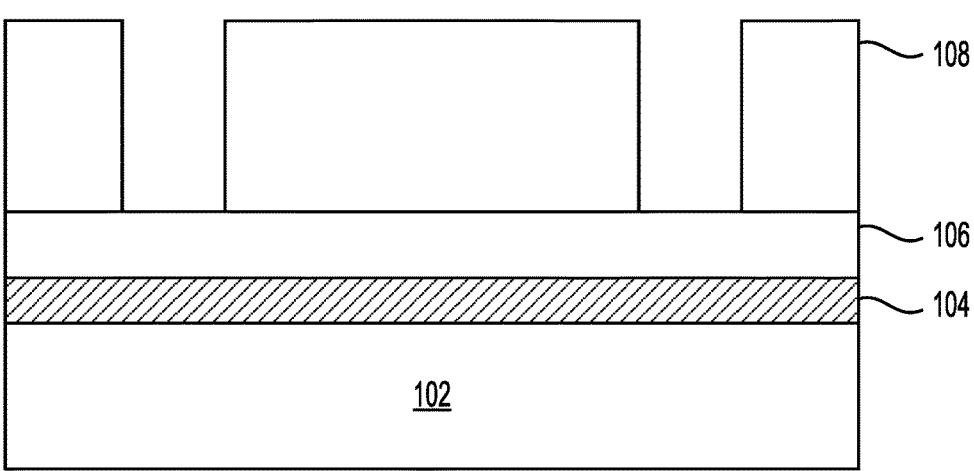
FIG. 3 shows a cross-section view of a superconducting device in accordance with one example.

FIG. 3 shows a cross-section view 300 of a superconducting device at another stage of processing in accordance with one example. After superconducting layer 106 is formed, a photo-lithography process may be used to pattern superconducting layer 106 to create superconducting wires or other superconducting structures. In one example, the superconducting wires may be formed using niobium or other suitable metals. Niobium superconducting wires may be 0.2 microns wide and approximately 25 microns long. Certain such wires may be as wide as 20 microns and may be slotted. The wires may be almost as long as the length or the width of an entire die. The layout for the superconducting structures may be created using a place and route design tool that is used to create the layout for the superconducting wires or other elements. As an example, photo-resist 108 may be patterned to protect only those areas of superconducting layer 106 that are needed to be formed as superconducting wires or other structures as defined by the layout of the particular layer, such as a metal layer. After etching the unwanted portions of superconducting layer 106, appropriate wires or other structures may be formed. In one example, as part of this step, additional dummy elements may be formed. Such dummy elements may be formed using niobium or as discussed later using other materials. The dummy elements may be formed in the same plane as the superconducting structures or wires. Although FIG. 3 shows a certain number of layers of the superconducting device arranged in a certain manner, there could be more or fewer numbers of layers arranged differently.

With continued reference to FIG. 3, alternatively, another dielectric layer may be formed over dielectric layer 104. That additional dielectric layer may be subjected to photo-lithography steps to create gaps that will eventually contain superconducting structures, such as wires. Thus, the dielectric layer may be patterned and then after etching, superconducting layer 106 may be formed on top of the additional dielectric layer. Next, using processes, such as chemical-mechanical polishing, the excess portions of the superconducting layer 106 may be removed leaving only the required superconducting structures or wires.

Figure 4:
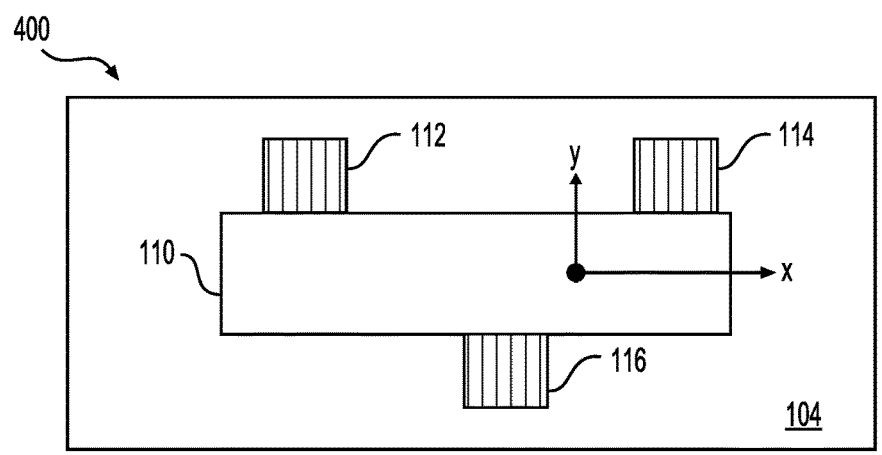
FIG. 4 shows a top view of a superconducting device in accordance with one example.

FIG. 4 shows a top view 400 of a superconducting device in accordance with one example. Top view 400 shows a superconducting wire 110 formed in a dielectric layer 104. Superconducting wire 110 has a first dimension in a horizontal direction X and a second dimension in a vertical direction Y. The first dimension may represent a length of superconducting wire 110 and the second dimension may represent a width of superconducting wire 110. Dummy elements 112, 114, and 116 are constructed in the same plane as the superconducting wire. As discussed earlier, these dummy elements may be formed using the process steps shown in FIGS. 1-3. In this example, each of the elements may be a nub or may include multiple nubs. Such dummy elements may only be formed in areas of the circuit layout where needed to shore up sensitive areas of the layout that may be most susceptible to problems caused by CTE mismatch. In addition, in certain examples, dummy elements may be doped with different types of dopants to reduce the CTE mismatch between superconducting wire 110 and dielectric layer 104. Although FIG. 4 shows a certain number of components of a superconducting device arranged in a certain manner, there could be more or fewer numbers of components arranged differently.

Figure 5:
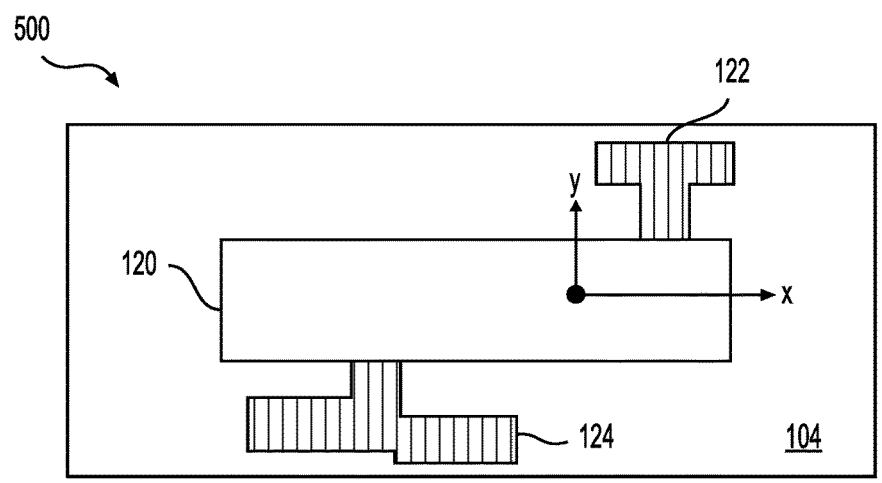
FIG. 5 shows a top view of a superconducting device in accordance with one example.

FIG. 5 shows a top view 500 of a superconducting device in accordance with one example. Top view 500 shows a superconducting wire 120 formed in a dielectric layer 104. Superconducting wire 120 has a first dimension in a horizontal direction X and a second dimension in a vertical direction Y. The first dimension may represent a length of superconducting wire 120 and the second dimension may represent a width of superconducting wire 120. Dummy elements 122 and 124 are constructed in the same plane as the superconducting wire. As discussed earlier, these dummy elements may be formed using the process steps shown in FIGS. 1-3. In this example, each of the elements may be a nub or may include multiple nubs. In addition to the nubs, to increase the safeguard against delamination at sidewalls, the dummy elements may be laid out with additional short-segment branches to increase the surface area between superconducting wire 120 and dielectric layer 104. Such dummy elements may only be formed in areas of the circuit layout where needed to shore up sensitive areas of the layout that may be most susceptible to problems caused by CTE mismatch. In addition, in certain examples, dummy elements may be doped with different types of dopants to reduce the CTE mismatch between superconducting wire 120 and dielectric layer 104. Although FIG. 5 shows a certain number of components of a superconducting device arranged in a certain manner, there could be more or fewer numbers of components arranged differently.

Figure 6:
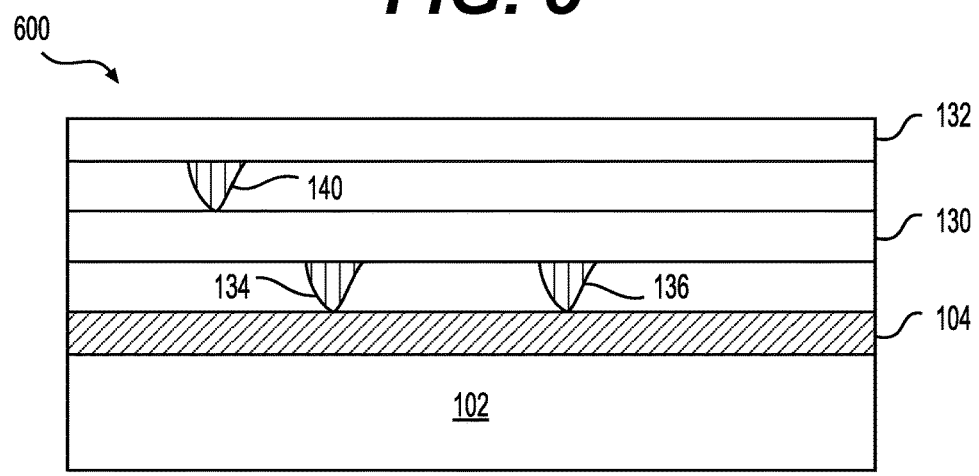
FIG. 6 shows a cross-section view of a superconducting device in accordance with one example.

FIG. 6 shows a cross-section view 600 of a superconducting device in accordance with one example. In this example, in addition to dummy elements discussed earlier, the superconducting device may also include structures similar to vias. Thus, vias 134 and 136 may be formed using materials similar to the dummy elements discussed above. Vias 134 and 136 may be formed in a plane that is orthogonal to the plane of the semiconducting wire 130. As shown in FIG. 6, the superconducting device may include other vias, such as via 140 that may be used to form an active connection with the metal wires, such as metal wire 132. Vias 134 and 136, however, are passive elements. Vias 134 and 136 may also help with reducing dishing of the plane during a chemical-mechanical polishing step. Thus, when the plane containing superconducting wire 130 is being planarized using a CMP process, vias 134 and 136 may help make the polish rate uniform across the wafer containing the superconducting device. Although FIG. 6 shows a certain number of layers of the superconducting device arranged in a certain manner, there could be more or fewer numbers of layers arranged differently.

Figure 7:
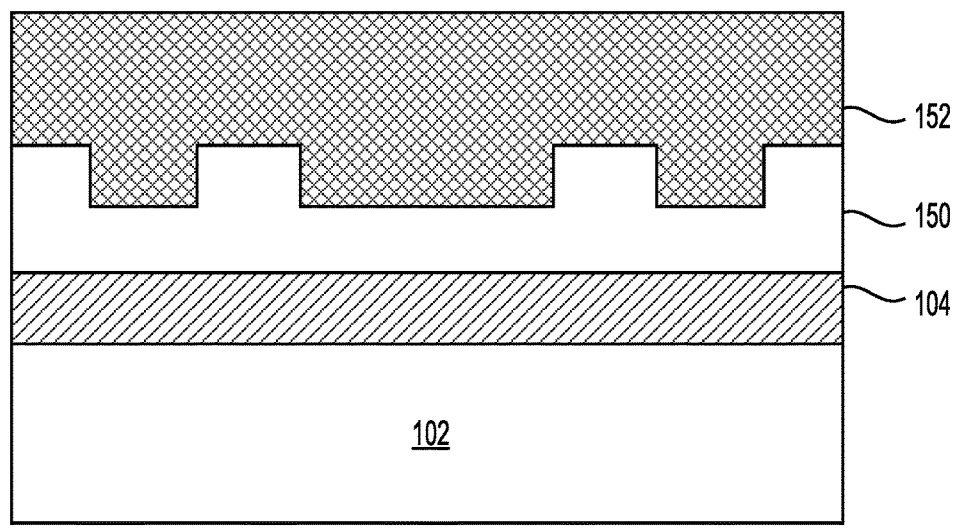
FIG. 7 shows a cross-section view of a superconducting device in accordance with one example.
Figure 8:
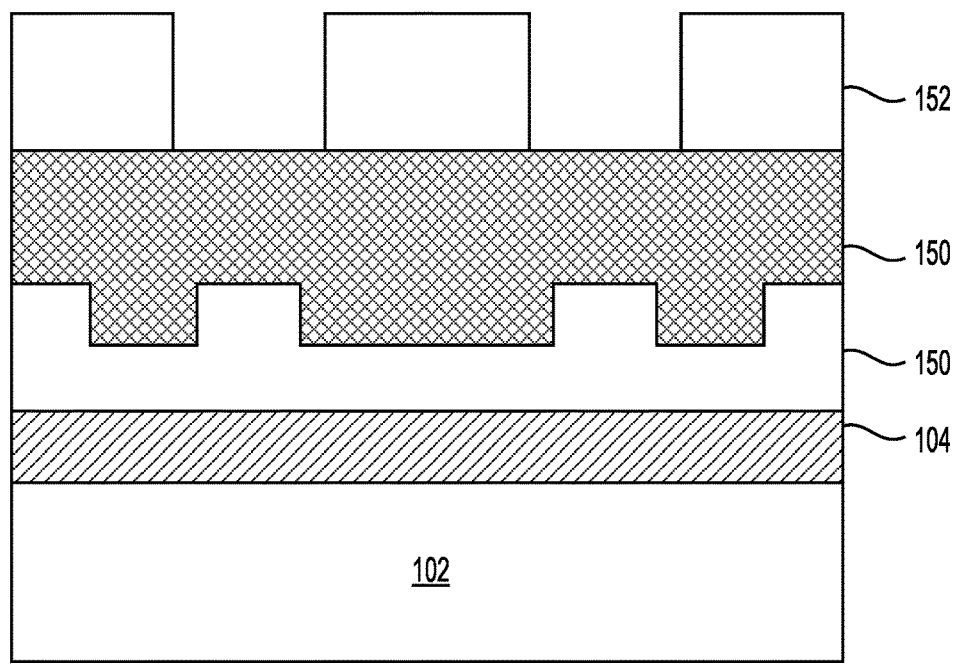
FIG. 8 shows a cross-section view of a superconducting device in accordance with one example.

FIG. 7 shows a cross-section view 700 of a superconducting device in accordance with one example. In this example, dummy elements may be formed using a metal or another material that is different from the material used to form the superconducting wire or other such active structures. As an example, while superconducting wire 150 may be formed using niobium, the dummy elements may be formed using any of tungsten, molybdenum, tantalum, chromium, or indium. Thus, in this example, after forming superconducting wire 150, a conformal dielectric layer (not shown) may be formed on the layer containing superconducting wire 150. Next, the material corresponding to the dummy elements may be deposited on top as part of layer 152. Next, as shown in cross-section view 800 of FIG. 8, photo-resist material 162 may be patterned to create the dummy elements. Other process steps may also be used to form the dummy elements. As an example, the dummy elements may be directly created using an electron beam. Although FIGS. 7 and 8 show a certain number of layers of the superconducting device arranged in a certain manner, there could be more or fewer numbers of layers arranged differently.

In conclusion, the present disclosure relates to a superconducting device including at least one superconducting element having a first coefficient of thermal expansion. The at least one superconducting element is formed on a dielectric layer having a second coefficient of thermal expansion and the first coefficient of thermal expansion is different from the second coefficient of thermal expansion causing a strain mismatch between the at least one superconducting element and the dielectric layer when the superconducting device is operating in a cryogenic environment. The superconducting device may also include at least one dummy element configured to lower stress at an interface between the at least one superconducting element and the dielectric layer when the at least one superconducting device is operating in the cryogenic environment.

The cryogenic environment may correspond to a temperature in a range of 4 Kelvin to 77 Kelvin. The at least one superconducting element may comprise Niobium. The at least one dummy element may comprise at least one of niobium, tungsten, molybdenum, tantalum, chromium, or indium. The at least one superconducting element may have a first dimension in a first direction and a second dimension in a second direction. The first dimension may be substantially greater than the second dimension; the at least one dummy element may include a plurality of nubs; and each of the plurality of nubs may be configured to connect with the at least one superconducting element along the first direction. The at least one dummy element may further comprise at least one via. The at least one superconducting element may be a wire formed in a plane and the at least one via may extend in a direction that is orthogonal to the plane. The at least one via may further be configured to reduce dishing of the plane during a chemical-mechanical polishing step.

In another aspect, the present disclosure relates to a superconducting device including at least one superconducting wire having a first coefficient of thermal expansion. The at least one superconducting wire is formed on a dielectric layer having a second coefficient of thermal expansion and the first coefficient of thermal expansion is different from the second coefficient of thermal expansion causing a strain mismatch between the at least one superconducting wire and the dielectric layer when the superconducting device is operating in a cryogenic environment. The superconducting device may also include at least one dummy element comprising a plurality of nubs, where each of the plurality of nubs is formed along the at least one superconducting wire. Each of the plurality of nubs is configured to lower stress at an interface between the at least one superconducting wire and the dielectric layer when the at least one superconducting device is operating in the cryogenic environment.

The cryogenic environment may correspond to a temperature in a range of 4 Kelvin to 77 Kelvin. The at least one superconducting wire may comprise Niobium. The at least one dummy element may comprise at least one of niobium, tungsten, molybdenum, tantalum, chromium, or indium. The at least one superconducting wire may have a first dimension in a first direction and a second dimension in a second direction. The first dimension may be substantially greater than the second dimension; the at least one dummy element may include a plurality of nubs; and each of the plurality of nubs may be configured to connect with the at least one superconducting wire along the first direction. The at least one dummy element may further include at least one via, where the at least one superconducting wire is formed in a plane and the at least one via extends in a direction that is orthogonal to the plane.

In yet another aspect, the present disclosure relates to a superconducting device including at least one superconducting wire having a first coefficient of thermal expansion. The at least one superconducting wire is formed on a dielectric layer having a second coefficient of thermal expansion and the first coefficient of thermal expansion is different from the second coefficient of thermal expansion causing a strain mismatch between the at least one superconducting wire and the dielectric layer when the superconducting device is operating in a cryogenic environment. The superconducting device may further include at least one dummy element including a plurality of nubs and at least one via. Each of the plurality of nubs is formed along the at least one superconducting wire, where each of the plurality of nubs is configured to lower stress at an interface between the at least one superconducting wire and the dielectric layer when the at least one superconducting device is operating in the cryogenic environment. The at least one dummy element may further include at least one via, where the at least one superconducting wire is formed in a plane and the at least one via extends in a direction that is orthogonal to the plane.

The cryogenic environment may correspond to a temperature in a range of 4 Kelvin to 77 Kelvin. The at least one superconducting wire may comprise Niobium. The at least one dummy element may comprise at least one of niobium, tungsten, molybdenum, tantalum, chromium, or indium. The at least one superconducting wire may have a first dimension in a first direction and a second dimension in a second direction. The first dimension may be substantially greater than the second dimension; the at least one dummy element may include a plurality of nubs; and each of the plurality of nubs may be configured to connect with the at least one superconducting wire along the first direction. The at least one via may further be configured to reduce dishing of the plane during a chemical-mechanical polishing step.

It is to be understood that the methods, modules, and components depicted herein are merely exemplary. For example, and without limitation, illustrative types of superconducting devices may include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc.

In addition, in an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above-described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A superconducting device comprising:
    at least one superconducting element having a first coefficient of thermal expansion, wherein the at least one superconducting element is formed in a first plane, wherein the at least one superconducting element has a first dimension in a first direction and a second dimension in a second direction, wherein the first dimension represents a length of the at least one superconducting element and the second dimension represents a width of the at least one superconducting element, and wherein the at least one superconducting element is formed on a dielectric layer having a second coefficient of thermal expansion, and wherein the first coefficient of thermal expansion is different from the second coefficient of thermal expansion causing a strain mismatch between the at least one superconducting element and the dielectric layer at temperatures below 77 K; and
    at least one dummy element configured to lower stress at an interface between the at least one superconducting element and the dielectric layer, wherein the at least one dummy element is configured to be an electrically passive element, wherein the at least one dummy element is formed in the first plane along the length of the at least one superconducting element, and wherein the at least one dummy element includes a plurality of nubs, and wherein each of the plurality of nubs is configured to protrude from the at least one superconducting element.

2. The superconducting device of claim 1, wherein the cryogenic environment corresponds to a temperature in a range of 4 Kelvin to 77 Kelvin.

3. The superconducting device of claim 1, wherein the at least one superconducting element comprises niobium.

4. The superconducting device of claim 3, wherein the at least one dummy element comprises at least one of niobium, tungsten, molybdenum, tantalum, chromium, or indium.

5. The superconducting device of claim 1, wherein the at least one dummy element further comprises at least one via, and wherein the at least one superconducting element is a wire formed in a plane and the at least one via extends in a direction that is orthogonal to the plane.

6. The superconducting device of claim 5, wherein the at least one via is further configured to reduce dishing of the plane during a chemical-mechanical polishing step.

7. A superconducting device comprising:
    at least one superconducting wire having a first coefficient of thermal expansion, wherein the at least one superconducting wire is formed on a dielectric layer having a second coefficient of thermal expansion, and wherein the first coefficient of thermal expansion is different from the second coefficient of thermal expansion causing a strain mismatch between the at least one superconducting wire and the dielectric layer when the superconducting device is operating in a cryogenic environment; and
    at least one dummy element comprising a plurality of nubs, wherein the at least one dummy element is configured to be an electrically passive element, wherein each of the plurality of nubs is formed along the at least one superconducting wire, wherein each of the plurality of nubs is configured to lower stress at an interface between the at least one superconducting wire and the dielectric layer at temperatures below 77K, and wherein at least a subset of the plurality of the nubs includes at least one short-segment branch configured to increase a surface area between the at least one superconducting wire and the at least one dummy element.

8. The superconducting device of claim 7, wherein the cryogenic environment corresponds to a temperature in a range of 4 Kelvin to 77 Kelvin.

9. The superconducting device of claim 7, wherein the at least one superconducting wire comprises niobium.

10. The superconducting device of claim 9, wherein the at least one dummy element comprises at least one of niobium, tungsten, molybdenum, tantalum, chromium, or indium.

11. The superconducting device of claim 7, wherein the at least one dummy element further comprises at least one via, and wherein the at least one superconducting wire is formed in a plane and the at least one via extends in a direction that is orthogonal to the plane.

12. The superconducting device of claim 11, wherein the at least one via is further configured to reduce dishing of the plane during a chemical-mechanical polishing step.

13. A superconducting device comprising:
    at least one superconducting wire having a first coefficient of thermal expansion, wherein the at least one superconducting wire is formed on a dielectric layer having a second coefficient of thermal expansion, and wherein the first coefficient of thermal expansion is different from the second coefficient of thermal expansion causing a strain mismatch between the at least one superconducting wire and the dielectric layer at temperatures below 77K; and
    at least one dummy element comprising a plurality of nubs and at least one via, wherein each of the plurality of nubs is formed along the at least one superconducting wire, wherein each of the plurality of nubs is configured to lower stress at an interface between the at least one superconducting wire and the dielectric layer, wherein the at least one dummy element is configured to be an electrically passive element, and wherein the at least one dummy element further comprises at least one via, and wherein the at least one superconducting wire is formed in a plane and the at least one via extends in a direction that is orthogonal to the plane.

14. The superconducting device of claim 13, wherein the cryogenic environment corresponds to a temperature in a range of 4 Kelvin to 77 Kelvin.

15. The superconducting device of claim 13, wherein the at least one superconducting wire comprises niobium.

16. The superconducting device of claim 15, wherein the at least one dummy element comprises at least one of niobium, tungsten, molybdenum, tantalum, chromium, or indium.

17. The superconducting device of claim 13, wherein the at least one via is further configured to reduce dishing of the plane during a chemical-mechanical polishing step.

* * * * *